(12) United States Patent
Takebayashi et al.

(10) Patent No.: US 11,951,583 B2
(45) Date of Patent: Apr. 9, 2024

(54) ELECTROSTATIC CHUCK WITH HIGH INSULATION PERFORMANCE AND ELECTROSTATIC ATTRACTION FORCE

(71) Applicant: NGK INSULATORS, LTD., Nagoya (JP)

(72) Inventors: Hiroshi Takebayashi, Handa (JP); Kenichiro Aikawa, Handa (JP); Tatsuya Kuno, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 339 days.

(21) Appl. No.: 17/462,048

(22) Filed: Aug. 31, 2021

(65) Prior Publication Data

US 2021/0394320 A1  Dec. 23, 2021

Related U.S. Application Data

(63) Continuation of application No. PCT/JP2020/022831, filed on Jun. 10, 2020.

(30) Foreign Application Priority Data

Jun. 28, 2019  (JP) ................................. 2019-121488

(51) Int. Cl.
*B23Q 3/15* (2006.01)
*B23K 1/00* (2006.01)
(Continued)

(52) U.S. Cl.
CPC .............. *B23Q 3/15* (2013.01); *B23K 1/0016* (2013.01); *B23K 1/19* (2013.01); *H01L 21/6833* (2013.01);
(Continued)

(58) Field of Classification Search
CPC .... B23K 1/0016; B23K 1/19; B23K 2103/52; B23Q 3/15; H01L 21/6831;
(Continued)

(56) References Cited

U.S. PATENT DOCUMENTS 4,480,284 A * 10/1984 Tojo .................... H01L 21/6833
361/230
5,324,053 A * 6/1994 Kubota ................. B25B 11/002
279/128
(Continued)

FOREIGN PATENT DOCUMENTS

CN       101030550 A    9/2007
JP       08-031917 A1   2/1996
(Continued)

OTHER PUBLICATIONS

English translation of the International Preliminary Report on Patentability (Chapter 1) dated Jan. 6, 2022 (Application No. PCT/JP2020/022831).

(Continued)

*Primary Examiner* — Jared Fureman
*Assistant Examiner* — Nicolas Bellido
(74) *Attorney, Agent, or Firm* — BURR PATENT LAW, PLLC

(57) ABSTRACT

An electrostatic chuck includes a ceramic base, a ceramic dielectric layer, an electrostatic electrode, and a ceramic insulating layer. The ceramic dielectric layer is positioned on the ceramic base and is thinner than the ceramic base. The electrostatic electrode is embedded between the ceramic dielectric layer and the ceramic base. The ceramic insulating layer is positioned on the ceramic dielectric layer and is thinner than the ceramic dielectric layer. The ceramic insulating layer has a higher volume resistivity and withstand voltage than the ceramic dielectric layer, and the ceramic (Continued)

dielectric layer has a higher dielectric constant than the ceramic insulating layer.

4 Claims, 3 Drawing Sheets

(51) Int. Cl.
*B23K 1/19* (2006.01)
*B23K 103/00* (2006.01)
*H01L 21/683* (2006.01)
*H01L 21/687* (2006.01)

(52) U.S. Cl.
CPC .... *H01L 21/68757* (2013.01); *B23K 2103/52* (2018.08)

(58) Field of Classification Search
CPC ............. H01L 21/6833; H01L 21/6875; H01L 21/68757; H02N 13/00
See application file for complete search history.

(56) References Cited

U.S. PATENT DOCUMENTS

| | | | | |
|---|---|---|---|---|
| 5,382,469 | A | * | 1/1995 | Kubota ................. C04B 35/117 428/472 |
| 2003/0047283 | A1 | | 3/2003 | Parkhe et al. |
| 2004/0218340 | A1 | * | 11/2004 | Kitabayashi ........... H02N 13/00 361/234 |
| 2006/0012087 | A1 | | 1/2006 | Matsuda et al. |
| 2007/0217117 | A1 | * | 9/2007 | Ohta ................... H01L 21/6833 361/234 |
| 2016/0148865 | A1 | | 5/2016 | Naoe et al. |

FOREIGN PATENT DOCUMENTS

| | | | | | |
|---|---|---|---|---|---|
| JP | H0831917 | A | * | 2/1996 | |
| JP | 2005-109234 | A | | 4/2005 | |
| JP | 2005-343733 | A1 | | 12/2005 | |
| JP | 2006-287210 | A1 | | 10/2006 | |
| JP | 2007-109827 | A | | 4/2007 | |
| JP | 2007137764 | A | * | 6/2007 | |
| JP | 2008160097 | A | * | 7/2008 | ......... H01L 21/6831 |
| JP | 2012119120 | A | * | 6/2012 | |

OTHER PUBLICATIONS

International Search Report and Written Opinion (Application No. PCT/JP2020/022831) dated Sep. 15, 2020.
Korean Office Action (with English translation) dated May 18, 2023 (Application No. 10-2021-7034011).
Chinese Office Action (Application No. 202080031109.5) dated May 26, 2023 (6 pages).
Chinese Office Action (Application No. 202080031109.5) dated Sep. 9, 2023 (6 pages).

* cited by examiner

ELECTROSTATIC CHUCK WITH HIGH INSULATION PERFORMANCE AND ELECTROSTATIC ATTRACTION FORCE

BACKGROUND OF THE INVENTION

1. Field of the Invention

The present invention relates to an electrostatic chuck.

2. Description of the Related Art

In transfer, exposure, a film deposition process such as CVD, washing, etching, and micromachining such as dicing, for a semiconductor wafer, an electrostatic chuck for attracting and holding the wafer has been used so far. An electrostatic chuck disclosed in Patent Literature (PTL) 1, for example, includes a ceramic base, a thin ceramic dielectric layer positioned on the ceramic base, and an electrostatic electrode embedded between the ceramic dielectric layer and the ceramic base (see FIG. 4). The surface of the ceramic dielectric layer serves as a wafer placement surface. In the disclosed electrostatic chuck, a material of the ceramic base and a material of the ceramic dielectric layer are each an alumina sintered body.

CITATION LIST

Patent Literature

PTL 1: JP 2005-343733 A

SUMMARY OF THE INVENTION

Because the material of the ceramic dielectric layer is the alumina sintered body, insulation performance (volume resistivity and withstand voltage) is high, but a dielectric constant is not so high. Therefore, when attracting the wafer toward the wafer placement surface, an electrostatic attraction force cannot be sufficiently obtained in some cases.

The present invention has been made with intent to solve the above-described problem, and a main object is to provide an electrostatic chuck with high insulation performance and a high electrostatic attraction force.

The present invention provides an electrostatic chuck including:
  a ceramic base;
  a ceramic dielectric layer positioned on the ceramic base and being thinner than the ceramic base;
  an electrostatic electrode embedded between the ceramic dielectric layer and the ceramic base; and
  a ceramic insulating layer positioned on the ceramic dielectric layer and being thinner than the ceramic dielectric layer,
  wherein the ceramic insulating layer has a higher volume resistivity and withstand voltage than the ceramic dielectric layer, and
  the ceramic dielectric layer has a higher dielectric constant than the ceramic insulating layer.

With the above-described electrostatic chuck, since the ceramic insulating layer has the higher volume resistivity and withstand voltage than the ceramic dielectric layer, insulation performance is held high by the ceramic insulating layer. On the other hand, since the ceramic dielectric layer has the higher dielectric constant than the ceramic insulating layer, an electrostatic attraction force increasing in proportion to the dielectric constant is increased by the ceramic dielectric layer. Thus, the electrostatic chuck according to the present invention has the high insulation performance and the high electrostatic attraction force.

In the electrostatic chuck according to the present invention, the ceramic insulating layer may be an aerosol deposition (AD) film or a thermally sprayed film. Particularly, the ceramic insulating layer is preferably the AD film. With use of the AD film, the volume resistivity and the withstand voltage are increased for the following reason. A glass phase with low insulation is not present in the AD film at the grain boundary between raw material grains, and the AD film is equivalent to a film obtained by sintering the raw material grains.

In the electrostatic chuck according to the present invention, a material of the ceramic dielectric layer is preferably barium titanate or lead zirconate titanate, and a material of the ceramic insulating layer is preferably alumina.

In the electrostatic chuck according to the present invention, the ceramic insulating layer may be disposed to cover an entire surface of the ceramic dielectric layer and may include a plurality of projections supporting a wafer.

In the electrostatic chuck according to the present invention, the ceramic dielectric layer may include a plurality of projections supporting a wafer, and the ceramic insulating layer may be disposed at least on top surfaces of the projections. The ceramic insulating layer may cover the entire surface of the ceramic dielectric layer instead of covering only the projections of the ceramic dielectric layer.

DETAILED DESCRIPTION OF THE INVENTION

Figure 1:
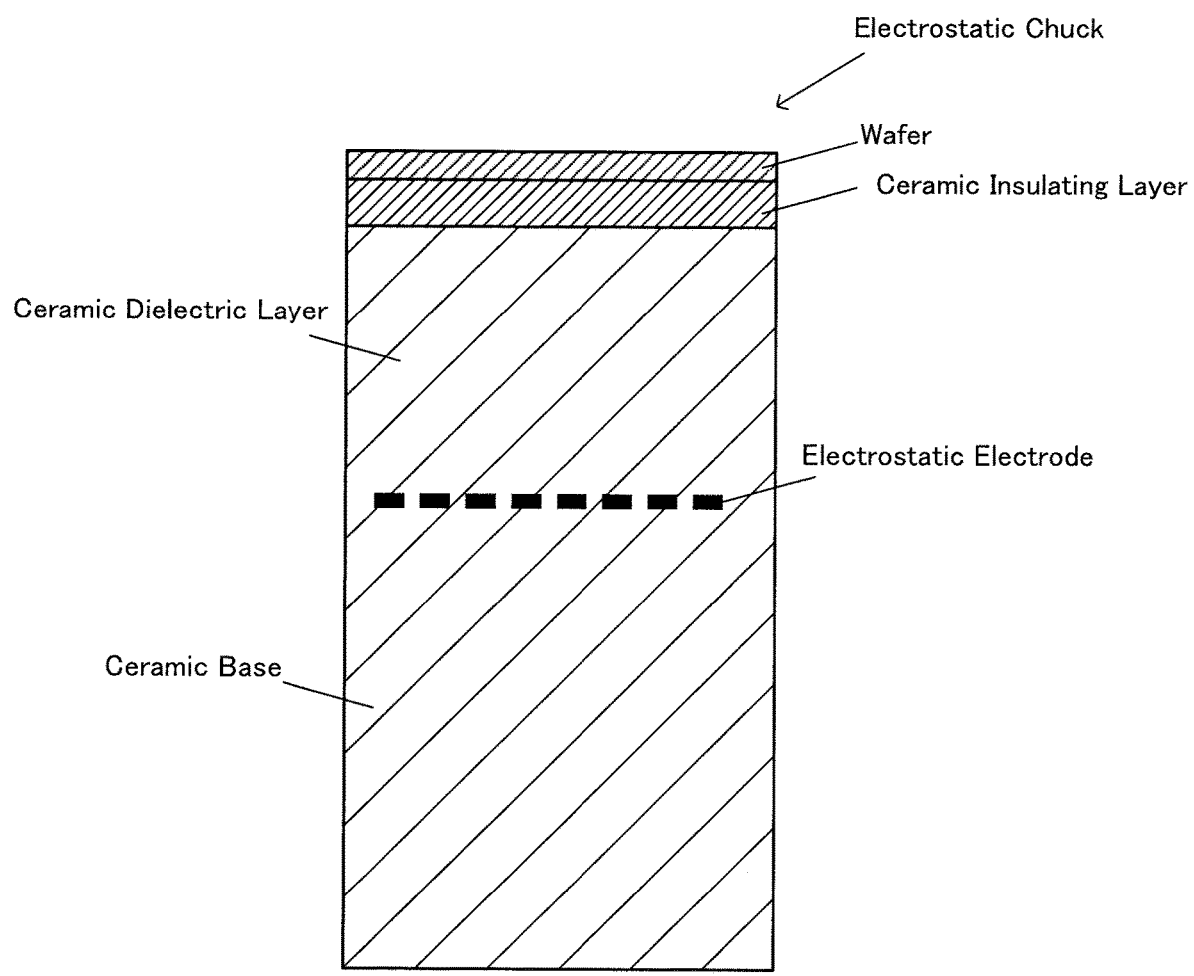
FIG. 1 is a vertical sectional view of an electrostatic chuck according to an embodiment.

A preferred embodiment of the present invention will be described below with reference to the drawing. FIG. 1 is a view (vertical sectional view) illustrating a step of manufacturing a wafer placement stand.

As illustrated in FIG. 1, an electrostatic chuck includes a ceramic base, a ceramic dielectric layer, an electrostatic electrode, and a ceramic insulating layer. The ceramic dielectric layer is positioned on the ceramic base and is thinner than the ceramic base. In this embodiment, the ceramic dielectric layer and the ceramic base are an integrally fired ceramic sintered body. The electrostatic electrode is embedded between the ceramic dielectric layer and the ceramic base. The ceramic insulating layer is positioned on the ceramic dielectric layer and is thinner than the ceramic dielectric layer. The ceramic insulating layer has a higher volume resistivity and withstand voltage than the ceramic dielectric layer, and the ceramic dielectric layer has a higher dielectric constant than the ceramic insulating layer.

The ceramic insulating layer may be a CVD film or PVD film, but it is preferably an AD film or a thermally sprayed film from a point of view that a thickness of the AD film or the thermally sprayed film can be relatively easily increased. In the AD film, particularly, the volume resistivity and the withstand voltage are increased for the following reason. A glass phase with low insulation is not present in the AD film at the grain boundary between raw material grains, and the AD film is equivalent to a film obtained by sintering the raw material grains. The AD film is a film formed by an AD method (including a plasma AD method). In the case of using the AD method, because ceramic grains can be deposited to form a film with an impact solidification phenomenon, there is no need of sintering the ceramic grains at a high temperature.

A material of the ceramic dielectric layer is preferably barium titanate or lead zirconate titanate, and a material of the ceramic insulating layer is preferably alumina.

In the above-described electrostatic chuck according to this embodiment, since the ceramic insulating layer has the higher volume resistivity and withstand voltage than the ceramic dielectric layer, insulation performance is held high by the ceramic insulating layer. On the other hand, since the ceramic dielectric layer has the higher dielectric constant than the ceramic insulating layer, an electrostatic attraction force increasing in proportion to the dielectric constant is increased by the ceramic dielectric layer.

As a matter of course, the present invention is in no way limited to the above-described embodiment, and the present invention can be implemented in various embodiments insofar as falling within the technical scope of the present invention.

Figure 2:
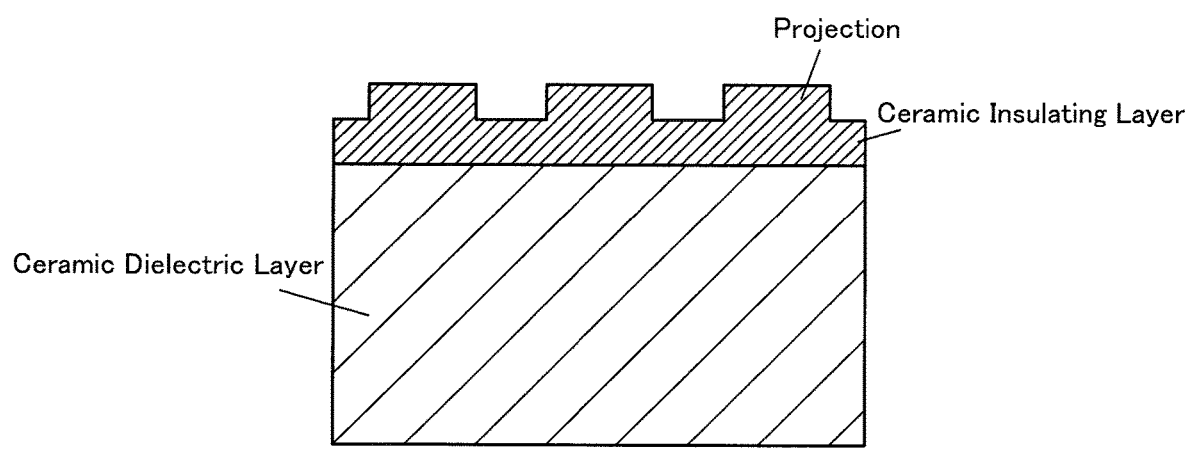
FIG. 2 is a vertical sectional view of an electrostatic chuck according to another embodiment.

For example, in the above-described embodiment, the ceramic insulating layer may be disposed to cover an entire surface of the ceramic dielectric layer and may include a plurality of projections supporting a wafer (see FIG. 2). Such a structure may be obtained, for example, by forming an AD film to cover the entire surface of the ceramic dielectric layer, polishing a surface of the AD film into a mirror finish surface (a surface with surface roughness Ra of, for example, 0.1 µm or less), and then forming the plurality of projections on the mirror finish surface by the AD method (including the plasma AD method). In such a case, a region of the ceramic dielectric layer where the projections are not formed remains as the mirror finish surface and hence does not become the cause of generating particles in a semiconductor process.

Figure 3:
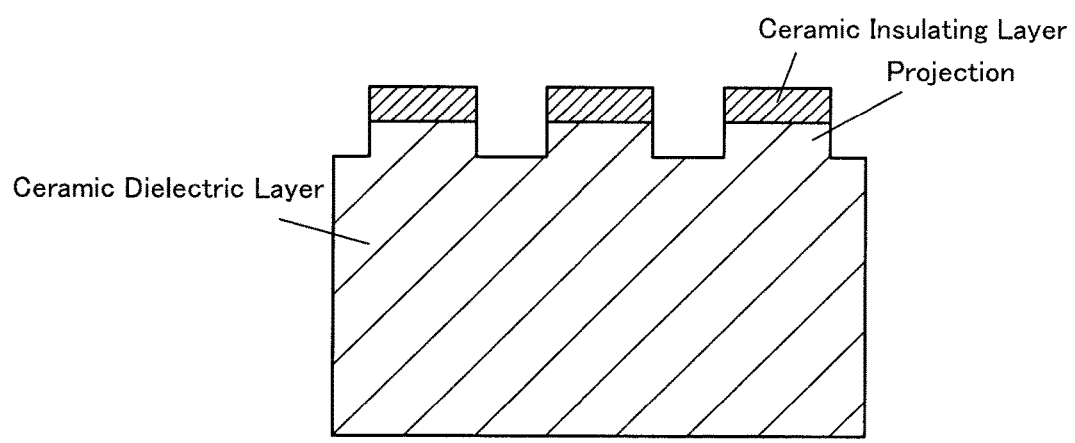
FIG. 3 is a vertical sectional view of an electrostatic chuck according to still another embodiment.
Figure 4:
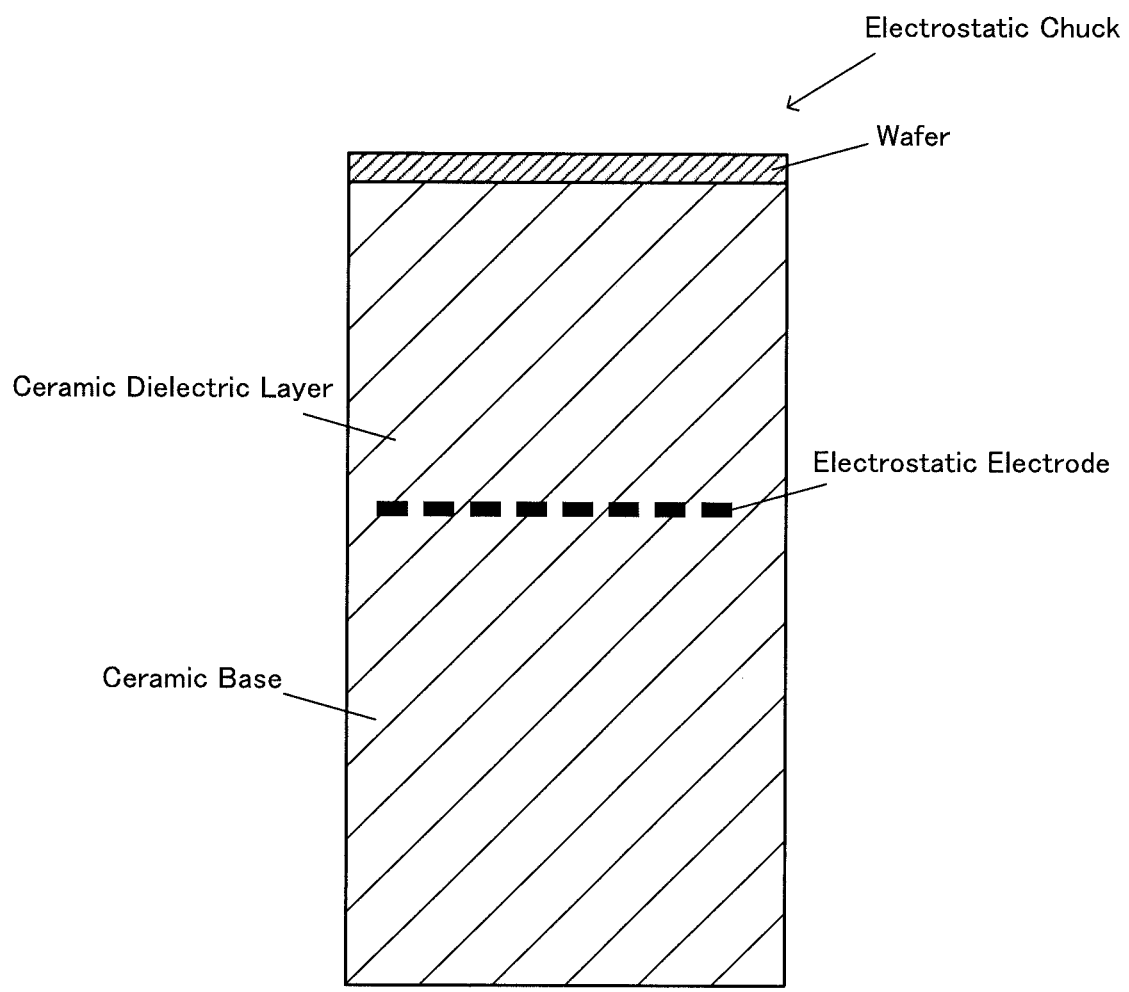
FIG. 4 is a vertical sectional view of an electrostatic chuck of related art.

In the above-described embodiment, the ceramic dielectric layer may include a plurality of projections supporting the wafer, and the ceramic insulating layer may be disposed only on top surfaces of the projections (see FIG. 3). From the viewpoint of increasing the withstand voltage, however, the ceramic insulating layer preferably covers the entire surface of the ceramic dielectric layer instead of covering only the projections of the ceramic dielectric layer.

In the above-described embodiment, at least one of an RF electrode and a heater electrode (resistance heating element) may be embedded in the ceramic base.

The present application claims priority from Japanese Patent Application No. 2019-121488, filed on Jun. 28, 2019, the entire contents of which are incorporated herein by reference.

What is claimed is:

1. An electrostatic chuck comprising:
a ceramic base;
a ceramic dielectric layer positioned on the ceramic base and being thinner than the ceramic base;
an electrostatic electrode embedded between the ceramic dielectric layer and the ceramic base; and
a ceramic insulating layer positioned on the ceramic dielectric layer and being thinner than the ceramic dielectric layer,
wherein the ceramic insulating layer has a higher volume resistivity and withstand voltage than the ceramic dielectric layer and is an aerosol deposition film, and the ceramic dielectric layer has a higher dielectric constant than the ceramic insulating layer; and
wherein the aerosol deposition film is void of a glass base with low insulation at grain boundaries between raw material grains.

2. The electrostatic chuck according to claim 1, wherein a material of the ceramic dielectric layer is barium titanate or lead zirconate titanate, and a material of the ceramic insulating layer is alumina.

3. The electrostatic chuck according to claim 1, wherein the ceramic insulating layer is disposed to cover an entire surface of the ceramic dielectric layer and includes a plurality of projections supporting a wafer.

4. The electrostatic chuck according to claim 1, wherein the ceramic dielectric layer includes a plurality of projections supporting a wafer, and the ceramic insulating layer is disposed at least on top surfaces of the projections.

* * * * *